United States Patent [19]

Tsukamoto et al.

[11] Patent Number: 5,107,311
[45] Date of Patent: Apr. 21, 1992

[54] SEMICONDUCTOR LIGHT-EMITTING DEVICE

[75] Inventors: Takeo Tsukamoto; Nobuo Watanabe, both of Atsugi; Masahiko Okunuki, Tokyo, all of Japan

[73] Assignee: Canon Kabushiki Kaisha, Tokyo, Japan

[21] Appl. No.: 560,769

[22] Filed: Jul. 31, 1990

[30] Foreign Application Priority Data

Aug. 2, 1989 [JP] Japan .................................. 1-200481
Aug. 4, 1989 [JP] Japan .................................. 1-203055

[51] Int. Cl.$^5$ ...................... H01L 33/00; H01L 29/48; H01L 29/90; H01L 29/06
[52] U.S. Cl. ...................................... 357/17; 357/15; 357/13; 357/52; 357/20
[58] Field of Search ...................... 357/17, 13, 15, 52, 357/90, 20

[56] References Cited

U.S. PATENT DOCUMENTS

| | | | |
|---|---|---|---|
| 4,303,930 | 12/1981 | Van Gorkom et al. | 357/13 |
| 4,810,934 | 3/1989 | Shimoda et al. | 315/107 |
| 4,833,507 | 5/1989 | Shimizu et al. | 357/4 |
| 4,904,895 | 2/1990 | Tsukamoto et al. | 313/336 |
| 4,999,683 | 3/1991 | Kiyomura et al. | 357/13 |

FOREIGN PATENT DOCUMENTS

| | | |
|---|---|---|
| 0170481 | 2/1986 | European Pat. Off. |
| 0359329 | 3/1990 | European Pat. Off. |
| 59-055085 | 3/1984 | Japan. |

OTHER PUBLICATIONS

*Physical Review,* vol. 102, No. 3, pp. 369-376, Apr. 15, 1986.
*Physics of Semiconductor Devices,* Sze, S., John Wiley & Sons, p. 73.
*Applied Physics Letters,* vol. 55, No. 4, Jul. 24, 1989, pp. 374-376, Chen, J. et al. "Photo Emission From Avalance Breakdown In The Collector Junction of GaAs-/AlGaAs Heterojunction Bipolar Transistors".
*IBM Technical Disclosure Bulletin,* vol. 30, No. 6, Nov. 1987, pp. 398-399, "Light-emitter Diode".
*Solid-State Electronics,* vol. 28, No. 9, Sep. 1985, pp. 847-854, Bryant, F., et al., "Blue Electroluminescence In Reverse-biased ZnS(Zn, Al) Diodes".

*Primary Examiner*—Mark Prenty
*Attorney, Agent, or Firm*—Fitzpatrick, Cella, Harper & Scinto

[57] ABSTRACT

A semiconductor light emitting device comprises a substrate, an n-type semiconductor layer formed on the substrate, a p-type semiconductor layer formed on a portion of a surface of the n-type semiconductor layer, an electrode for applying a reverse biasing voltage to the PN junction to cause an avalanche breakdown and an area formed in a portion of the PN junction. The p-type semiconductor layers forms a planar type PN junction with the n-type semiconductor layer. The area formed in a portion of the PN junction has a lower break down voltage than that of other area.

10 Claims, 5 Drawing Sheets

SEMICONDUCTOR LIGHT-EMITTING DEVICE

BACKGROUND OF THE INVENTION

1. Field of the Invention

The present invention relates to a semiconductor light-emitting device which has a planar type PN junction or a Schottky junction and produces a light by applying a reverse bias to the junction to cause an avalanche breakdown.

2. Related Background Art

Photo-emission from avalanche breakdown has been reported by an article "Photo emission from avalanche breakdown" by A. G. Chynoweth and H. K. Mckey, Phys. Rev., Vol. 102, p.369, 1956. On the other hand, an application of the photo emission phenomenon to a light emitting semiconductor element is reported in "A study of the nature and characteristics of light radiation in reverse-biased silicon junctions" by C. B. Williams and K. Daneshver, Conf. Proc. IEEE, p.161, 1988. In this article, it is reported that a photo emission intensity on a Si PN junction interface is 0.01 W/cm$^2$. The semiconductor devices in those articles comprise planar type PN junctions as described in "Physics of Semiconductor Devices" by S. M. Sze, John Wiley & Sons, p. 73.

In the prior art devices, because of the planar type PN junction, there exists a portion having a cylindrical radius of curvature or spherical radius of curvature around the junction. Since an electric field acting on the junction is higher in the portion having the cylindrical or spherical radius of curvature than in a planar junction portion, the photo emission by the avalanche breakdown occurs only in the high electric field zone, that is, only in the periphery of the junction, and it is not possible to uniformly emit light throughout the junction. In such a planar junction, there occurs photo-emission by an electric field concentration due to ununiformity of a paterning shape in the formation of the junction or photo-emission by an electric field concentration due to defects. Thus, photo-emission by inadvertent factors governs the light intensity of the photo emission or the position of the photo emission. Accordingly, it is not possible to form a light emitting device with a high control.

SUMMARY OF THE INVENTION

It is an object of the present invention to provide a semiconductor light emitting device which solves the problems encountered in the prior art devices, can be manufactured with a high control and emits light uniformly.

The above object of the present invention is achieved by a semiconductor light emitting device comprising:

a substrate;

an n-type semiconductor layer disposed on said substrate;

a p-type semiconductor layer on a portion of a surface of said n-type semiconductor layer;

said p-type semiconductor layer defining a planar type PN junction with said n-type semiconductor layer wherein said PN junction comprises first and second areas;

an electorde for applying a reverse biasing voltage to said PN junction to cause an avalanche breakdown;

wherein said first area has a lower avalanche that of said second area.

Further, the above object of the present invention is achieved by a semiconductor light emitting device comprising:

a substrate;

an n-type semiconductor layer disposed on said substrate;

a Schottky electrode layer disposed on said n-type semiconductor layer;

said Schottky electrode layer defining a Schottky junction with said n-type semiconductor layer wherein said Schottky junction comprises first and second areas; and a contact electrode for applying a reverse biasing voltage to said Schottky junction to cause an avalanche breakdown;

wherein said area has a lower avalanche breakdown voltage than said second area.

DESCRIPTION OF THE PREFERRED EMBODIMENTS

Figure 1A:
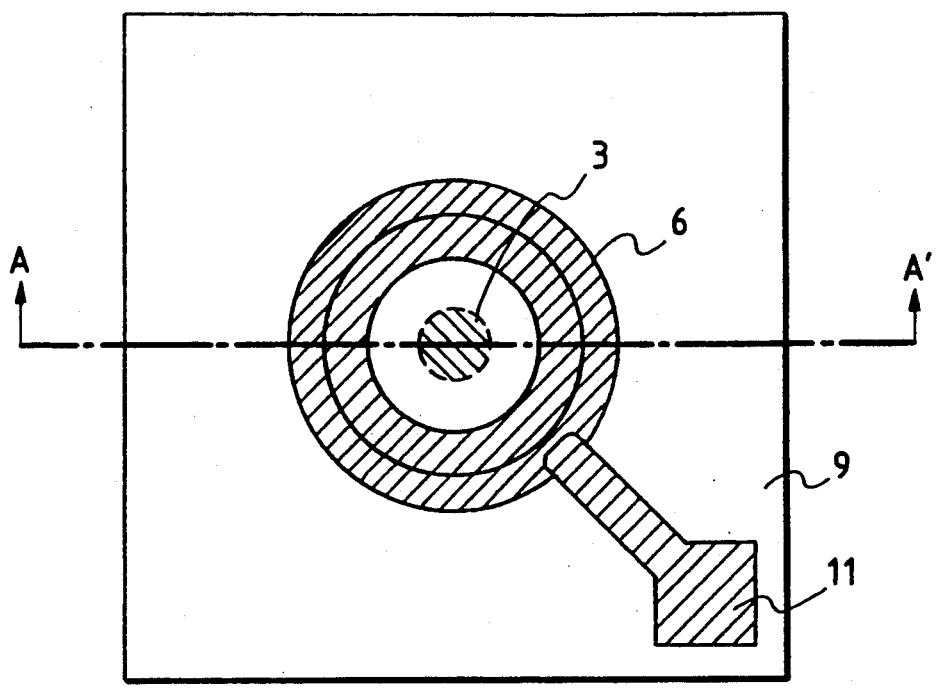
FIGS. 1A and 1B show a plan view and a cross-sectional view of a first embodiemnt of a semiconductor light emitting device of the present invention.
Figure 1B:
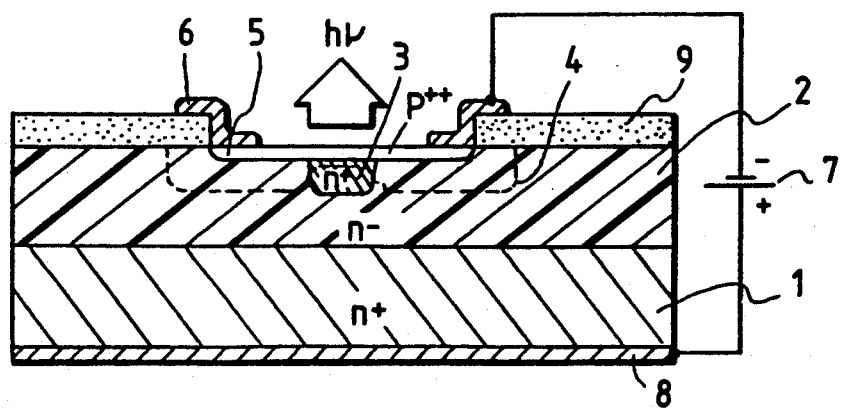

FIGS. 1A and 1B show a plan view and an A—A' sectional view of a first embodiment of the semiconductor light emitting device of the present invention. This device manufactured by the following process.

An n-type semiconductor layer 2 having an impurity concentration of $3 \times 10^{16}$ cm$^{-3}$ was formed on an n-type semiconductor substrate 1 (GaAs (100) in the present embodiment) by monochrome beam epitaxy (MBE) growth. Photoresist in an area 3 is cut by a photolithography resist process, and Si ions were injected therein at an acceleration voltage of 80 KeV. Further, photoresist in an area 5 was cut by a similar resist process and Zn ions were injected therein at an acceleration voltage of 40 KeV.

It is then annealed in an arsine environment at 850° C. for 30 seconds to activate the impurity atoms. The area 3 was rendered to a highly doped n-type area having a peak impurity concentration of approximately $1 \times 10^{18}$ cm$^{-3}$, and the area 5 to a p-type semiconductor layer having a peak impurity concentration of no smaller than approximately $1 \times 10^{19}$ cm$^{-3}$. The size of the highly doped n-type area 3 is preferably no larger than 5 μm in diameter. When it is larger than 5 μm, uniform light emission is not attained and heat generation increases. The thickness of the p-type semiconductor layer is preferably no larger than 0.1 μm. If it is larger than 0.1 μm, light transmittance rapidly decreases.

SiO$_2$ was sputtered on the semiconductor layer to form an insulation layer 9. Photoresist at a predetermined position was cut by the same resist process as that described above and a portion of the insulation layer 9 was etched off to form an opening. Cr/Au was vapor-deposited thereon and an unnecessary portion was removed by etching, and an ohmic contact electrode 6 to the p-type semiconductor was formed. An Al contact electrode 11 was formed to be connected to the electrode 6. An ohmic contact electrode 8 was formed on a bottom surface of the substrate 1. A reverse biasing electric field was applied to the device thus formed from a power supply 7 through electrodes 6 and 8 so that a light hv was emitted from the top of the area 3.

The operation of the device of the present invention is now explained.

Figure 2:
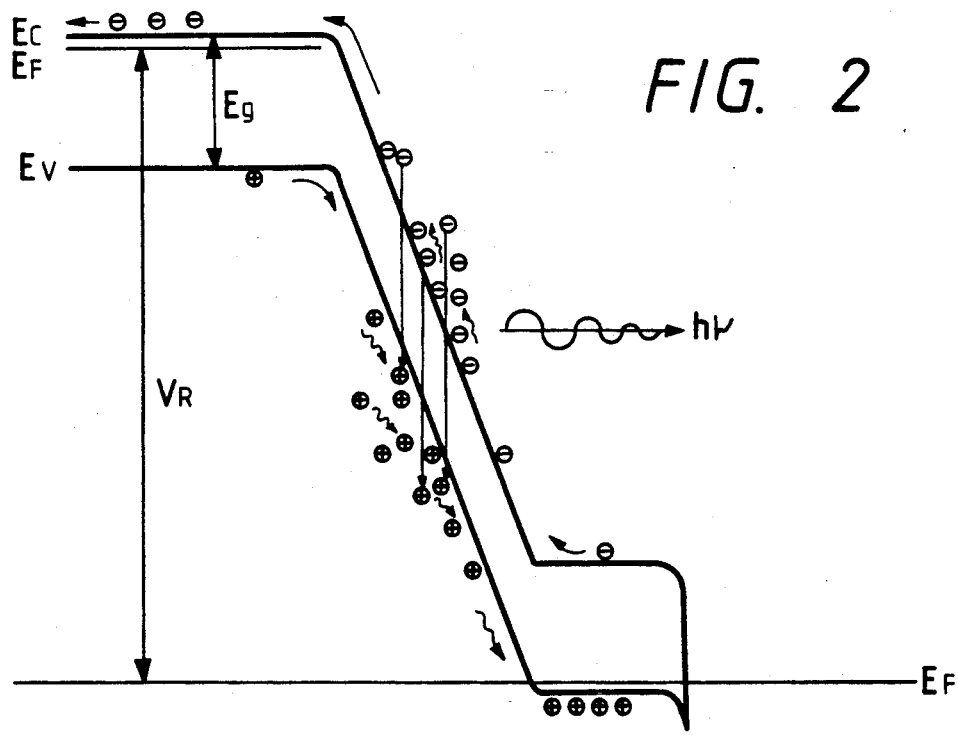
FIG. 2 shows an energy band of the device shown in FIG. 1.

FIG. 2 shows an energy band of the semiconductor light emitting device of the present invention. As shown in FIG. 2, by jointing the p-type semiconductor layer to the n-type semiconductor layer and applying the reverse bias to cause the avalanche breakdown, a number of electrons and holes are generated in a depletion layer The generated electrons and holes cause not only a normal inter-band transition shown by a in FIG. 3 but also a recombination of carriers having a high energy shown by b or an intra-band transition shown by c, and the light is emitted.

In the present embodiment, the highly doped n-type area 3 which is distinctive from other area is formed in the n-type semiconductor layer 2 to form a depletion layer shown by a broken line 4 in FIG. 1B. An uniform and high electric field area is formed throughout the highly doped n-type area 3 so that the light emission uniformly occurs only in the highly doped area.

In the present embodiment, by forming the highly doped area, the high electric field is formed to increase an electron-hole pair generation efficiency to increase the light emission probability and attain a brightness control. Further, by applying a high energy to the electrons-holes, a light having a larger energy than a band gap Eg is emitted.

In the present embodiment, the n-type semiconductor is used as the semiconductor substrate. Thus, a highest electric field is formed below the p-type semiconductor which is exposed to the surface, and the electrons which are minority carriers in the p-type semiconductor most act on the avalanche amplification. As a result, where a substrate (for example, silicon) in which the electron-hole pair generation efficiency varies depending on the type of carriers and the probability of generation of the electron-hole pairs by the electron is larger than the probability of generation of the electron-hole pairs by the holes, the electron generation efficiency is improved by the present embodiment.

In the present embodiment, it is necessary that the thickness of the p-type semiconductor layer is very thin enough to fully transmit the light generated at the PN junction interface and reduce a light transmission loss.

Figure 4:
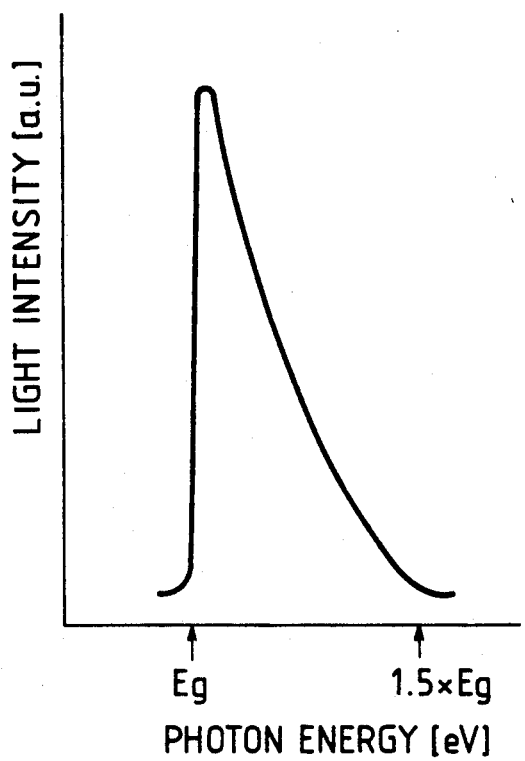
FIG. 4 shows a relation between a photon energy and a light intensity in the device shown in FIG. 1.

By the above arrangement, a light emitting device having a relation between the photon energy and the light intensity as shown in FIG. 4 is manufactured with a high control.

Figure 5:
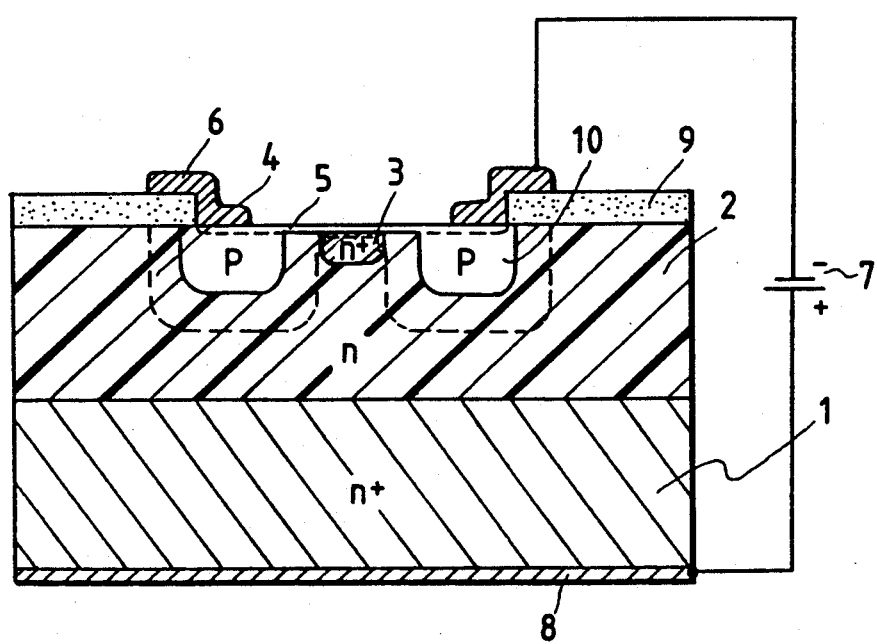
FIG. 5 shows a cross-sectional view of a second embodiment of the present invention.

FIG. 5 shows a second embodiment of the present invention. FIG. 5 shows a cross-sectional view of the device as FIG. 1B does. In FIG. 5, the like elements to those shown in FIG. 1B are designated by the like numerals. The device was manufactured in the following process.

An n-type semiconductor layer 2 having an impurity concentration of $5 \times 10^{16}$ cm$^{-3}$ was epitaxially grown on an n-type semiconductor substrate (Si (100) in the present embodiment) by a vapor deposition (CVD) method. Then, $SiO_2$ was formed to a thickness of 4000 Å by thermal diffusion, and resist at a predetermined position was cut by a resist process and $SiO_2$ was removed by fluodic acid etchant to form a donut-shaped opening on the top of the area 10. Then, B (boron) was thermal-diffused by appropriate dopant to form a p-type guard ring area 10. Then, the $SiO_2$ area at the top of the light emission area was removed by the resist process and the etchant. P ions (phosphorus) were injected into the area 3 and Ga(galium) ions were injected into the area 5 to make the area 3 to the n-type semiconductor having a peak impurity concentration of approximately $8 \times 10^{17}$ cm$^{-3}$ and the area 5 to the p-type semiconductor having a peak impurity concentration of no smaller than approximately $1 \times 10^{19}$. The ions were injected at a low acceleration so that the thickness of the area 5 is no larger than 500 Å, and it was appropriately etched. Then, ohmic contact electrodes 6 and 8 were formed to complete the light emitting device. In the present embodiment, the guard ring area 10 is formed around the highly doped n-type area 3 to form the depletion layer shown by the broken line 4 so that the electric field is further concentrated to the area 3 to improve the light emission efficiency.

Figure 6A:
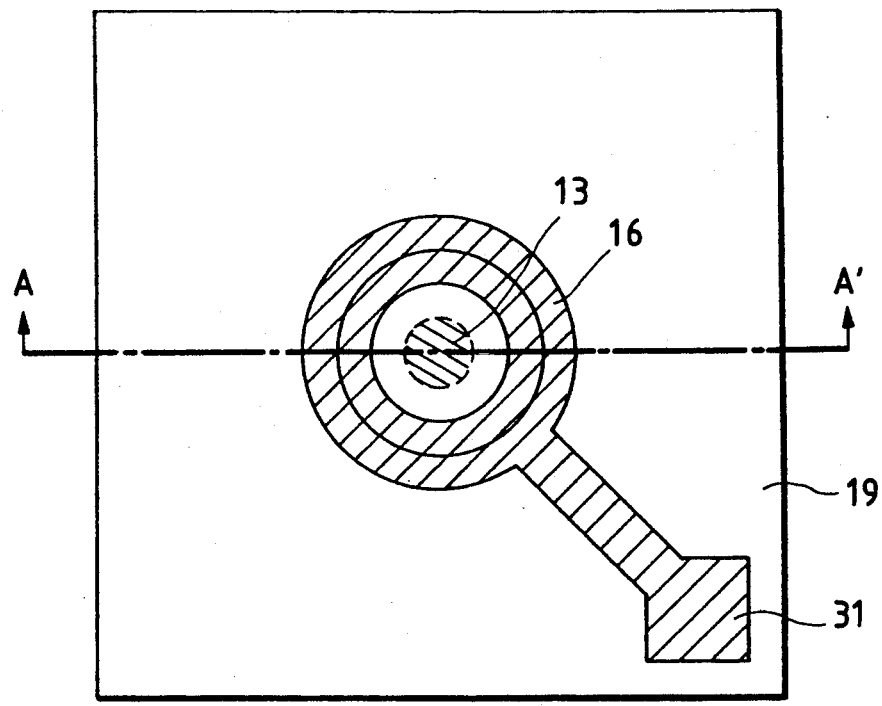
FIGS. 6A and 6B show a plan view and a sectional view of a third embodiment of the present invention.
Figure 6B:
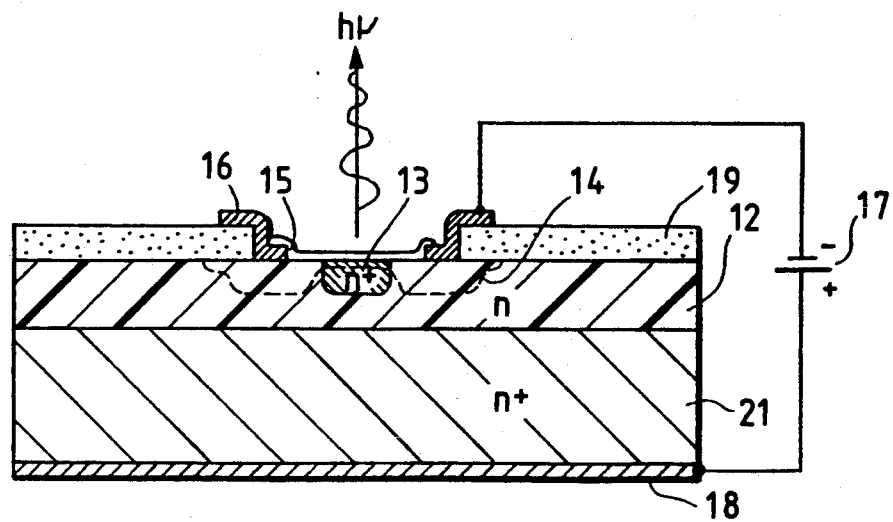

FIGS. 6A and 6B show a plan view and an A—A' sectional view of a third embodiemnt of the semiconductor light emitting device of the present invention. This device was manufactured in the following process.

First, an n-type semiconductor layer 12 having an impurity concentration of $3 \times 10^{16}$ cm$^{-3}$ was formed on an n-type semiconductor substrate 21 (GaAs (100) in the present embodiemnt) by molecule beam epitaxy (MBE) growth. Photoresist in an area 13 was cut by a photolithography resist process, and Si ions were injected therein at an acceleration voltage of 80 KeV. Then, it was annealed in an arsine environment at 850° C. for 30 seconds to activate the impurity atoms. The area 13 was rendered to a highly doped semiconductor area having a peak impurity concentration of approximately $1 \times 10^{18}$ cm$^{-3}$.

Then, $SiO_2$ was deposited by a sputtering method to a thickness of 4000 Å, and resist at a predetermined position was cut by the same resist process as that described above. The $SiO_2$ at a portion of the top of the device was removed by fluodic acid wet etching and an insulation layer 19 was formed. Then, Cr/Au was vapor-deposited and unnecessary portion was removed by etching. An ohmic contact electrode layer 16 was formed to contact to a Schottky electrode 15 to be formed later. An ohmic contact electrode 18 was also formed on the bottom surface of the substrate 21.

W (tungsten) was deposited as a Schottky electrode 15 to a thickness of approximately 150 Å by electron beam (EB) vapor deposition to from a Schottky junction. The n value was 1.05 at a barrier height $\phi_{SB}=0.8$ eV of the Schottky junction. Finally, an Al contact electrode 31 was formed. A reverse biasing electric field was applied to the device thus manufactured from a power supply 17 through electrodes 16 and 18. The light hv was emitted from the top of the area 13.

The operation of the device of the present invention is now explained.

Figure 3:
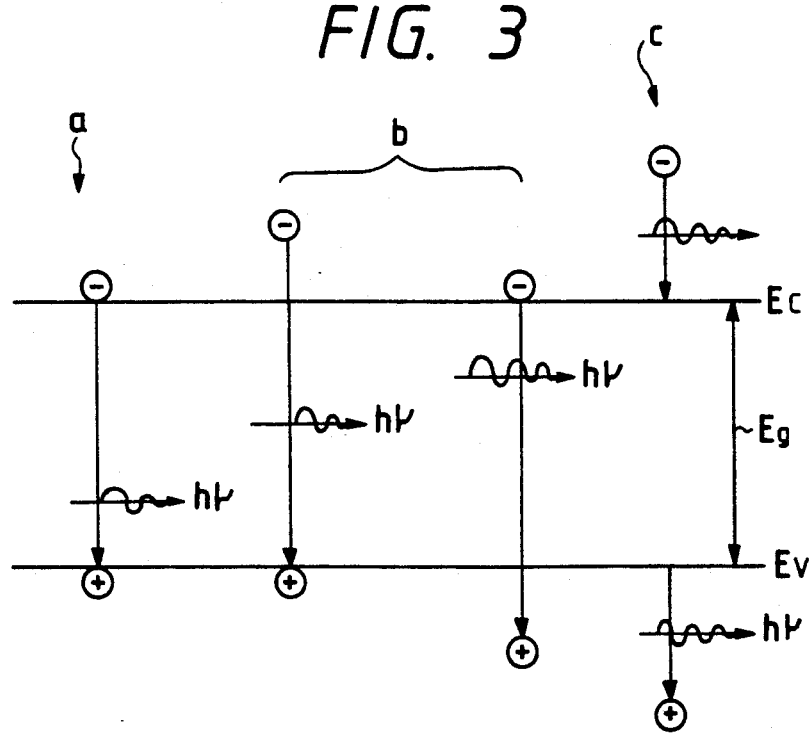
FIG. 3 illustrates a light emission process in the device of the present invention.
Figure 7:
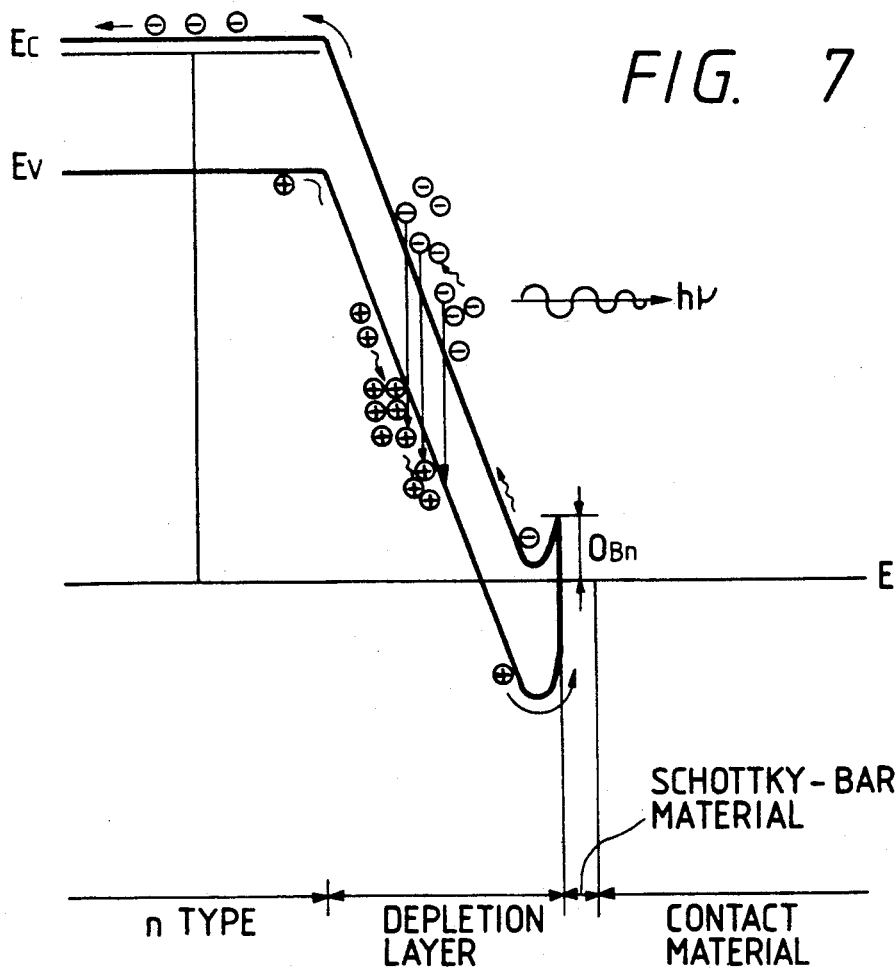
FIG. 7 shows an energy band of the device shown in FIG. 6.

FIG. 7 shows an energy band of the semiconductor light emitting device of the present invention. As shown in FIG. 7, the Schottky electrode layer is connected to the n-type semiconductor layer and the reverse bias is applied thereto to cause the avalanche breakdown so that a number of electrons and holes are generated in the depletion layers. The generated electrons and holes causes the inter-band transition, carrier recombination or intra-band transition as shown in FIG. 3 to emit a light.

In the present embodiment, the highly doped n-type area 13 which is distinctive from other area is formed in the n-type semiconductor layer 12 to form the depletion layer as shown by the broken line 14 in FIG. 6B. By forming a uniform and high electric field area throughout the highly doped n-type area 13, the light emission occurs uniformly only in the highly doped area.

In the present embodiment, the highly doped area is formed as described above to form the high electric field and increase the electron-hole pair generation efficiency and increase the probability of light emission in order to attain the brightness control. Further, a large energy is applied to the electrons-holes so that a light having a larger energy than the band gap Eg is emitted.

In the present embodiment, the n-type semiconductor is used as the semiconductor substrate. Thus, the highest electric field is formed below the Schottky electrode on the surface and the electrons in the Schottky electrode most act on the avalanche amplification. Accordingly, where the substrate (for example, silicon) in which the electron-hole pair generation efficiency varies depending on the type of carrier and the probability of generation of the electron-hole pairs by the electrons is larger than the probability of generation of the electron-hole pairs by the holes, the electron generation efficiency is improved by the present embodiment.

In the present embodiment, it is necessary that the thickness of the Schottky electrode layer be very thin enough to fully transmit the light generated at the PN junction interface and reduce the light transmission loss. In this connection, the thickness of the electrode layer is preferably no longer than 0.1 $\mu$m. In the present embodiment, a relation between the photon energy and the light intensity is same as that shown in FIG. 4 for the first embodiment.

Figure 8:
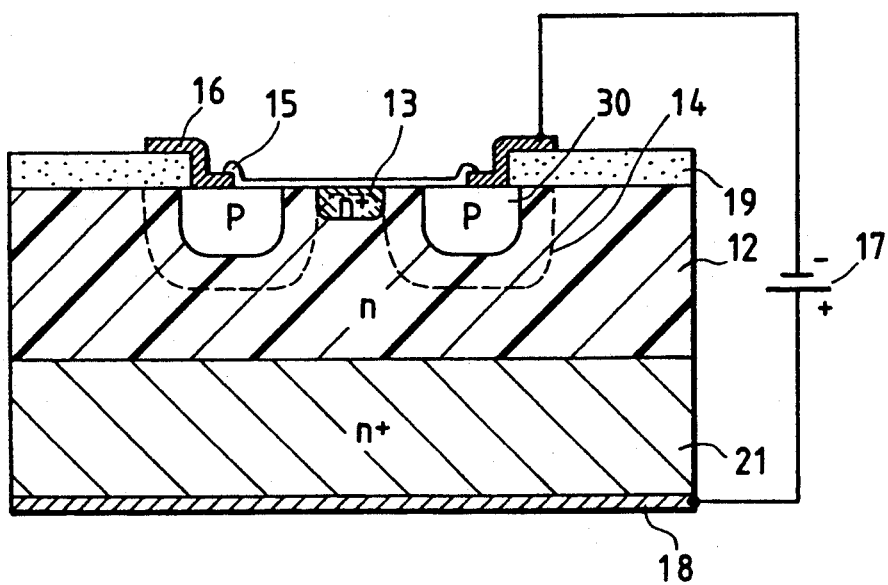
FIG. 8 shows a sectional view of a fourth embodiment of the present invention.

FIG. 8 shows a fourth embodiment of the present invention. FIG. 8 shows a sectional view of the device as FIG. 6B does. In FIG. 8, the like elements to those shown in FIG. 6B are designated by the like numerals. This device was manufactured by the following process.

First, an n-type semiconductor layer 12 having an impurity concentration of $5 \times 10^{16}$ cm$^{-3}$ was epitaxially grown on an n-type semiconductor substrate 21 (Si (100) in the present embodiment) by a vapor deposition (CVD) method. Then, SiO$_2$ was formed to a thickness of 4000 Å by thermal diffusion. Resist at a predetermined position was cut by the resist process, and the SiO$_2$ at that position was removed by fluodic acid etchant to form a donut-shaped opening on an area 30. Then, B (boron) was thermal-diffused by appropriate dopant to form a p-type guard ring area 30. The SiO$_2$ at the top of the light emission area was removed by the above-mentioned resist process and etchant, and P (phosphorus) ions were injected in an area 13 in the same manner as that of the third embodiment to form the n-type semiconductor having a peak impurity concentration of approximately $8 \times 10^{17}$ cm$^{-3}$ after annealing. Then, ohmic contact electrodes 16 and 18 were formed, and finally Au was vapor-deposited to a thickness of 150 Å to form a Schottky electrode 15.

In the present embodiment, Au is used as the material of the Schottky electrode although it is not restrictive and any other material which forms a Schottky junction may be used. A material other than metal such as silicide, carbonide or boronide may be used. A material which has a low resistivity, a high light transmittance and exhibits uniformity even if it is thin is preferable.

In the present embodiment, the guard ring area 30 is formed around the highly doped n-type area 13 to form the depletion layer shown by the broken line 14 and the electric field is concentrated thereto. Accordingly, the light emission efficiency is improved.

The present invention may be applicable in various forms other than the above embodiments. The present invention covers all such modifications without departing from the scope of claims.

We claim:

1. A semiconductor light emitting device comprising:
   a substrate;
   an n-type semiconductor layer disposed on said substrate;
   a p-type semiconductor layer disposed on a portion of a surface of said n-type semiconductor layer,
   said p-type semiconductor layer defining a planar type PN junction with said n-type semiconductor layer, said PN junction having at least a plane portion parallel to a surface of said substrate, said PN junction comprising first and second areas, said first area being arranged only at a part of a center of said plane portion; and
   an electrode for applying a reverse bias voltage to said PN junction to cause an avalanche breakdown, wherein said first area has a lower avalanche breakdown voltage than an avalanche breakdown voltage of said second area.

2. A semiconductor light emitting device according to claim 1, wherein said first area has a higher impurity concentration than an impurity concentration of said second area.

3. A semiconductor light emitting device according to claim 1, wherein the p-type semiconductor layer comprises first and second portions, wherein said first portion has a thickness greater than a thickness of said second portion.

4. A semiconductor light emitting device according to claim 1, wherein said first area has a diameter of a most 5 $\mu$m.

5. A semiconductor light emitting device according to claim 1, wherein the thickness of the p-type semiconductor layer in said first area is at most 0.1 $\mu$m.

6. A semiconductor light emitting device comprising:
   a substrate
   an n-type semiconductor layer disposed on said substrate;
   a Schottky electrode layer disposed on said n-type semiconductor layer,
   said Schottky electrode layer defining a Schottky junction with said n-type semiconductor layer, wherein said Schottky junction comprises first and second areas; and
   a contact electrode for applying a reverse bias voltage to said Schottky junction to cause an avalanche breakdown,
   wherein said first area has a lower avalanche breakdown voltage than an avalanche breakdown voltage of said second area.

7. A semiconductor light emitting device according to claim 6, wherein said first area has a higher impurity concentration than an impurity concentration of said second area.

8. A semiconductor light emitting device according to claim 6, further comprising a ring-shaped p-type semiconductor layer disposed around said first area.

9. A semiconductor light emitting device according to claim 6, wherein said first area has a diameter of at most 5 µm.

10. A semiconductor light emitting device according to claim 6, wherein the thickness of the Schottky electrode layer in said first area is at most 0.1 µm.

* * * * *

UNITED STATES PATENT AND TRADEMARK OFFICE
CERTIFICATE OF CORRECTION

PATENT NO. : 5,107,311
DATED : April 21, 1992
INVENTOR(S) : TAKEO TSUKAMOTO, ET AL.

It is certified that error appears in the above-identified patent and that said Letters Patent is hereby corrected as shown below:

ABSTRACT

Line 9, "layers" should read --layer--.
Line 12, "area." should read --areas.--.

COLUMN 6

Line 52, "substrate" should read --substrate;--.

COLUMN 1

Line 39, "paterning" should read --patterning--.
Line 59, "on" should read --disposed on--.
Line 65, "electorde" should read --electrode--.
Line 67, "avalanche" should read --avalanche breakdown voltage than--.

UNITED STATES PATENT AND TRADEMARK OFFICE
CERTIFICATE OF CORRECTION

PATENT NO. : 5,107,311
DATED : April 21, 1992
INVENTOR(S) : TAKEO TSUKAMOTO, ET AL.

It is certified that error appears in the above-identified patent and that said Letters Patent is hereby corrected as shown below:

COLUMN 5

Line 19, "electrons-holes" should read --electron-holes--.

Signed and Sealed this

Twenty-second Day of March, 1994

Attest:

BRUCE LEHMAN

Attesting Officer

Commissioner of Patents and Trademarks